US008989398B2

(12) United States Patent
Fawcett

(10) Patent No.: US 8,989,398 B2
(45) Date of Patent: Mar. 24, 2015

(54) CROWD NOISE AUDIO PROCESS AND APPARATUS

(75) Inventor: Benjamin Fawcett, London (GB)

(73) Assignee: Sony Computer Entertainment Europe Limited (GB)

( * ) Notice: Subject to any disclaimer, the term of this patent is extended or adjusted under 35 U.S.C. 154(b) by 1452 days.

(21) Appl. No.: 12/280,439

(22) PCT Filed: Mar. 23, 2007

(86) PCT No.: PCT/GB2007/001080

§ 371 (c)(1),
(2), (4) Date: Nov. 13, 2008

(87) PCT Pub. No.: WO2007/110618

PCT Pub. Date: Oct. 4, 2007

(65) Prior Publication Data

US 2009/0143139 A1 Jun. 4, 2009

(30) Foreign Application Priority Data

Mar. 24, 2006 (GB) .................................. 0605983.6

(51) Int. Cl.
*H03G 3/00* (2006.01)
*G10L 21/00* (2013.01)
*G10H 1/00* (2006.01)
(Continued)

(52) U.S. Cl.
CPC .............. *G10L 21/00* (2013.01); *G10H 1/0091* (2013.01); *G10H 7/006* (2013.01); *G10K 15/12* (2013.01); *A63F 2300/6018* (2013.01); *A63F 2300/6081* (2013.01); *G10H 2210/311* (2013.01); *G10H 2220/135* (2013.01); *G10H 2250/041* (2013.01);
(Continued)

(58) Field of Classification Search
CPC .................. G10H 2250/041; G10H 2250/365; G10H 2250/401; G10H 2250/495
USPC .......... 463/1, 3, 4, 35, 41; 704/223, 264, 270; 381/61; 700/94
See application file for complete search history.

(56) References Cited

U.S. PATENT DOCUMENTS 4,144,790 A 3/1979 Suchoff
4,164,884 A 8/1979 Kakehashi
(Continued)

OTHER PUBLICATIONS

Kurasaki, K. (2003). Power tools for Reason 2.5: Master the world's most popular virtual studio software (pp. 92-97). San Francisco, Calif: Backbeat Books.*
(Continued)

*Primary Examiner* — Duc Nguyen
*Assistant Examiner* — Kile Blair
(74) *Attorney, Agent, or Firm* — Lerner, David, Littenberg, Krumholz & Mentlik, LLP

(57) ABSTRACT

An audio apparatus is suitable for generating crowd sounds from an audio signal is disclosed in which the apparatus comprises modulation means operable to modulate a noise signal in response to the audio signal to generate a modulated noise signal, and diffusion delay means. The diffusion delay means is operable to apply a series of two or more delay operations, the input signal to a first such delay operation in the series being the modulated noise signal, and input to each subsequent delay operation in the series being the output signal generated by a preceding delay operation. Each delay operation comprises modifying that operation's input signal by the addition of a delayed version of that operation's input signal.

24 Claims, 3 Drawing Sheets

(51) Int. Cl.
*G10H 7/00* (2006.01)
*G10K 15/12* (2006.01)

(52) U.S. Cl.
CPC .... *G10H 2250/365* (2013.01); *G10H 2250/495* (2013.01)
USPC .......... 381/61

(56) References Cited

U.S. PATENT DOCUMENTS

| | | | | |
|---|---|---|---|---|
| 4,352,954 | A * | 10/1982 | Franssen et al. | 381/63 |
| 4,480,833 | A | 11/1984 | Barcelow et al. | |
| 4,691,920 | A | 9/1987 | Murphy et al. | |
| 5,036,541 | A | 7/1991 | Kato | |
| 5,444,180 | A | 8/1995 | Shioda | |
| 5,555,306 | A | 9/1996 | Gerzon | |
| 6,935,959 | B2 * | 8/2005 | Danieli et al. | 463/42 |

OTHER PUBLICATIONS

Schroeder, M. R., Natural Sounding Artificial Reverberation, J. Audio Eng. Soc., vol. 10, No. 3, pp. 219-223, Jul. 1962.*

International Search Report and Written Opinion dated Jun. 18, 2007 from the corresponding PCT/GB2007/001080.

UK Search Report dated Jul. 11, 2006 from corresponding GB0605983.6.

J.R. Parker and S. Chan: "Sound Synthesis for the Web, Games, and Virtual Reality "International Conference on Computer Graphics and Interactive Techniques ACM SIGGRAPH 2003, 2003, XP002436853, San Diego, CA. Mentioned in the International Search Report and International Preliminary Report on Patentability of the corresponding PCT/GB2007/001080; the whole document.

International Preliminary Report on Patentability dated Feb. 14, 2008 from the corresponding PCT/GB2007/001080.

* cited by examiner

CROWD NOISE AUDIO PROCESS AND APPARATUS

The present invention relates to an audio process and apparatus. In particular, it relates to an audio process and apparatus for generating in-game ambience.

Modern video games typically feature high-quality graphics and audio that provide a sense of immersion and atmosphere for the player or players. For some games, such as sports games and stadium games, the sound of a crowd is an important part of this atmosphere, and is generally reactive to the state of the game. Where the identity of a team is a significant feature in a game, the crowds may be differentiated by team-specific chants or slogans.

To obtain these chants, then where the sport and teams actually exist, the chants may be recorded live. However, where the sport, teams or chants are fictional, the chants may have to be recorded by a crowd in a studio. Both options are expensive for the developer of a game, and are inflexible and limit interaction for the player of a game.

The present invention is directed toward alleviating, mitigating or addressing the above problems.

In a first aspect of the present invention, an audio apparatus is suitable for generating crowd sounds from an audio signal, and comprises modulation means operable to modulate a noise signal in response to the audio signal to generate a modulated noise signal, and diffusion delay means; in which the diffusion delay means is operable to apply a series of two or more delay operations, the input signal to a first such delay operation in the series being the modulated noise signal, and input to each subsequent delay operation in the series being the output signal generated by a preceding delay operation, with each delay operation comprising modifying that operation's input signal by the addition of a delayed version of that operation's input signal.

The audio apparatus therefore provides a simple means for a game developer to obtain specific desired crowd chants from input speech, and in a similar manner can also provide a game player with the flexibility to customise or add crowd chants during a game.

In a second aspect of the present invention, a method of audio processing is disclosed corresponding to the operation of the audio apparatus.

Embodiments of the present invention will now be described by way of example with reference to the accompanying drawings, in which.

An audio process and corresponding apparatus are disclosed. In the following description, a number of specific details are presented in order to provide a thorough understanding of embodiments of the present invention. It will be apparent, however, to a person skilled in the art that these specific details need not be employed to practice the present invention. Conversely, specific details known to the person skilled in the art are omitted for the purposes of clarity in presenting the embodiments.

Embodiments of the present invention allow a single person (or indeed a relatively small number of people), whether a game developer or a game player, to input their voice into a crowd chant apparatus and obtain an audio output resembling a stadium crowd chanting their words.

Figure 1:
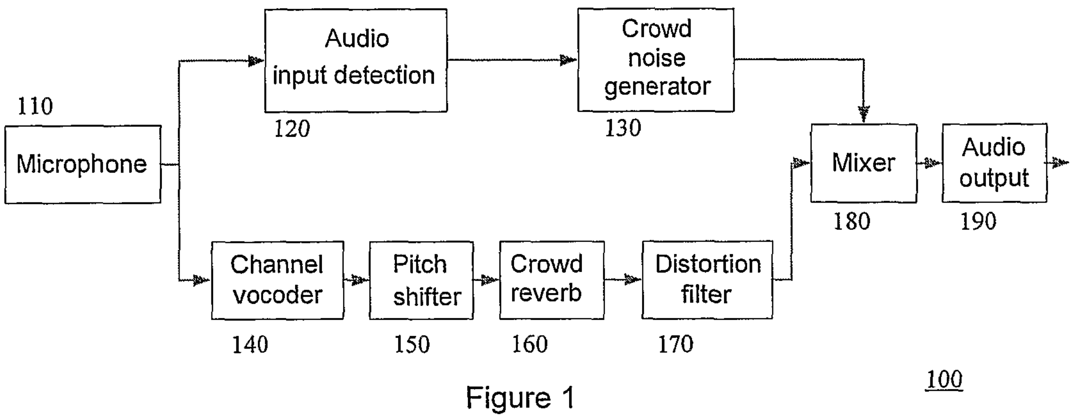
FIG. 1 is a block diagram of a crowd chant apparatus in accordance with an embodiment of the present invention.

Referring to FIG. 1, in an embodiment of the present invention a crowd chant apparatus 100 comprises a microphone 110 operably coupled to an input detector 120 and to a modulation means such as a channel vocoder 140. A vocoder (a name derived from voice encoder, also sometimes called a voder) is a speech analyzer and synthesizer. In one form, a vocoder examines speech by finding speech components at one or more frequency bands, and measuring how their spectral or amplitude characteristics change over time. This results in a series of coefficients representing these bands at any particular time as the user speaks. In doing so, the vocoder dramatically reduces the amount of information needed to store speech, from a complete recording to a much smaller series of coefficients. To recreate speech, the vocoder simply reverses the process, creating an audio signal (e.g. a noise signal) and then modifying it at the various frequency bands by a stage that filters the frequency content based on the originally recorded series of coefficients.

In operation, the input detector 120 controls a crowd noise generator 130 that outputs a background crowd noise to a mixer 180. In parallel, the channel vocoder 140 outputs a transformed version of the microphone input to an optional pitch shifter 150. The pitch shifter 150 in turn outputs to a crowd reverberation unit 160, and the resulting signal is passed though an optional distortion filter 170 before being mixed with the background crowd noise by mixer 180. The mixed signal is output as audio for left and right channels.

Specifically, the channel vocoder 140 splits the input signal into a plurality of frequency bands, for example 64 bands. The amplitude of each band is then used to shape, or modulate, a second signal to give it the frequency characteristics of the input signal. In an embodiment of the present invention, this second signal is white noise. The resulting output therefore is a noise signal spectrally modulated by the formants of any speech within the input signal. If listened to, this modulated signal resembles a large group of different voices saying the same thing.

It will be appreciated that the second, white noise signal is used to simulate the spectral characteristics of a crowd. Consequently, any suitably shaped noise such as pink or blue noise, or noise spectrally shaped by measurements from real crowd noise, may be similarly applied.

The modulated signal output by the channel vocoder 140 is then applied to the pitch shifter 150. The pitch shifter enables the output of the vocoder to be pitched up or down by an arbitrary amount to compensate for low or high pitched input signals of the user. It achieves this by modifying (in a known manner) the mean pitch of the modulated noise signal output by the vocoder 140. Alternatively or in addition, the pitch shifter can be similarly used to achieve a desired average pitch; for example, in a fantasy game with non-human spectators having very high or low pitched voices.

Figure 2:
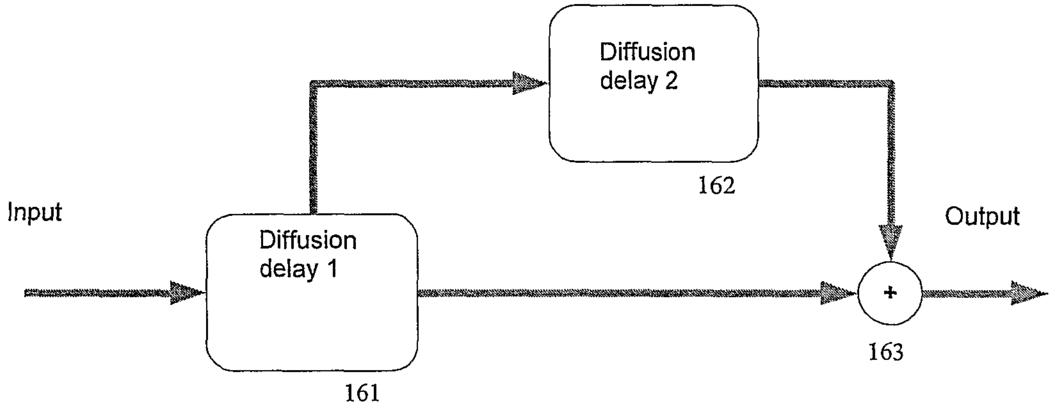
FIG. 2 is a block diagram of a crowd reverberation unit in accordance with an embodiment of the present invention.

Referring now also to FIG. 2, the pitch-adjusted output is passed to the crowd reverberation unit 160. In an embodiment of the present invention, the crowd reverberation unit comprises two or more diffusion delay units (161, 162). The diffusion delay units apply a reverberant spread to the input signal that is characteristic of physically diffuse sound sources, such as large crowds. The diffusion delay units are arranged such that the output of the first diffusion delay unit is passed to the second diffusion delay unit, and is also mixed (by a mixer 163) with the output of the second diffusion delay unit. This provides for the effect of a crowd source from one side of a stadium being echoed or repeated from the other side of the stadium.

Adjusting the relative volumes of the first and second diffusion delay units (161, 162) affects the perceived stadium acoustics, with the stadium effect becoming more prominent as the second diffusion delay output becomes louder.

It will be appreciated that alternative arrangements of diffusion delay units are envisaged, such as more than two diffusion delay units to simulate multiple crowd echoes, or that second and subsequent diffusion delay units may receive the same input, with a pure delay, as the first diffusion delay unit, rather than receiving the output of that first diffusion delay unit.

Figure 3:
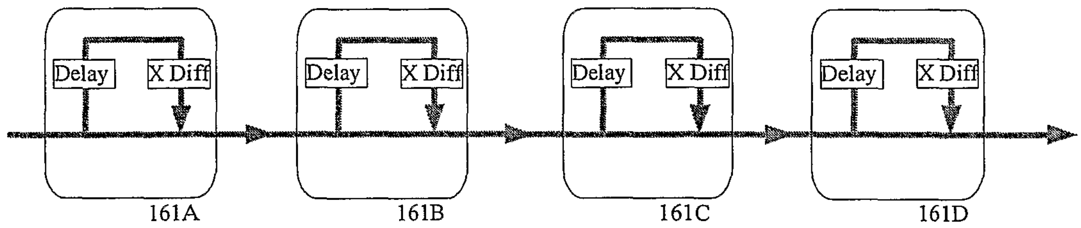
FIG. 3 is a block diagram of a diffusion delay unit in accordance with an embodiment of the present invention.

Referring now also to FIG. 3, in an embodiment of the present invention each diffusion delay unit (161, 162) comprises a series of two or more delay means, such as the four delay modules 161A-D shown in FIG. 3. Each delay module applies a delay, preferably each of different respective duration and optionally of random duration within preferred bounds. Following its delay, each delay module feeds back a proportion of its input signal, the proportion being determined by multiplying (X) by an attenuating factor DIFF. DIFF may be the same for each delay module or different between delay modules or sub-groups of delay modules. The resulting modified signal is then passed to the next delay module. The cumulative effect of applying the delay modules is to overlay differently timed and attenuated copies of the input signal to create a final diffuse modulated signal.

Thus for a delay of length $\alpha=2$ and an input signal x, for example, a delay module would initially output:

| time | input | output |
|---|---|---|
| t | x(t) | x(t) |
| t + 1 | x(t + 1) | x(t + 1) |
| t + 2 | x(t + 2) | x(t + 2) + DIFF(x(t)) |
| t + 3 | x(t + 3) | x(t + 3) + DIFF(x(t + 1)). |

The outputs above are each used as inputs to the next delay module, so generating the cumulative effect described above.

As the input signal has previously been processed by the vocoder to sound like a large group of people, the subjective acoustic effect of the diffusion delay unit is to physically distribute groups of people around the user by virtue of the apparently different arrival times, and thus distances, of their voices to the ear of the user.

It will be appreciated that the attentuating factor DIFF may alternatively be applied prior to the delay.

Figure 4:
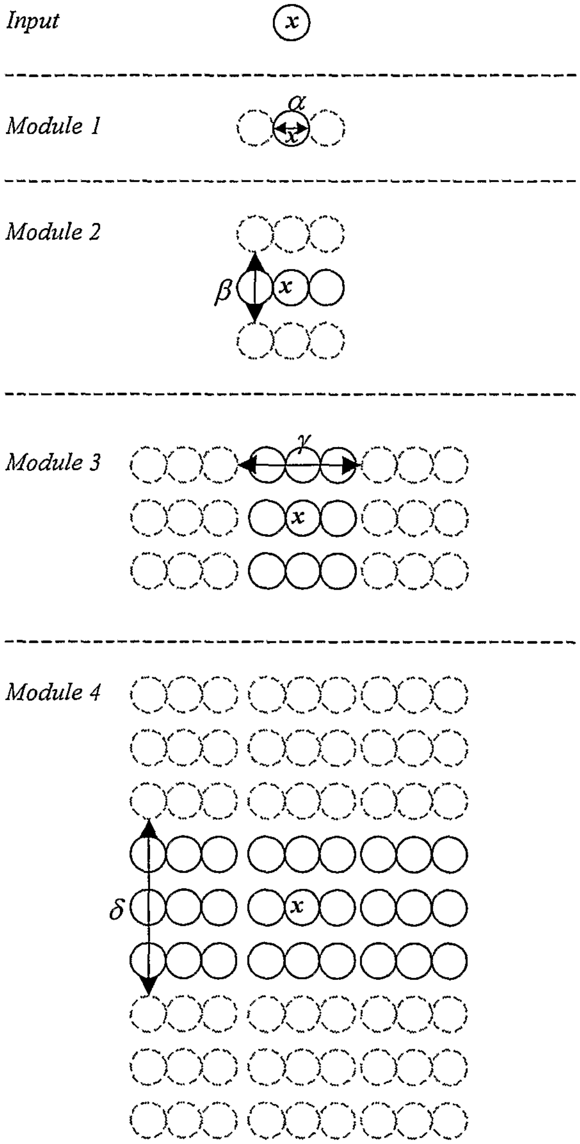
FIG. 4 is a schematic diagram of a virtual audio effect in accordance with an embodiment of the present invention.

FIG. 4 illustrates this effect in an idealised fashion for four successive delay modules, identified in FIG. 4 as modules 1 to 4. The user, signified by an x, would perceive the initial audio input as a being group of voices surrounding them, signified by the circle drawn around x. The delay module 1 then applies a delay $\alpha$ consistent with an acoustic path length a little larger than the imagined physical size of the current group of voices, and feeds the signal back with an attenuating value of DIFF, creating the impression of an additional group or groups (if in stereo), being slightly more distant. This is then added to the initial input.

This combined signal is then passed to the delay module 2, which applies a delay $\beta$ consistent with a slightly longer acoustic path length and thus greater distance to the source. In conjunction with further attenuation at each successive stage, the effect is that the previous three groups now have sets of slightly more distant neighbouring groups themselves.

As can be seen from FIG. 4, successive delay modules with successively longer delays $\gamma$ and $\delta$ result in a geometric growth in the apparent crowd size surrounding the user, giving the desired effect of being in a stadium crowd.

It will be appreciated that the resulting neat arrangement of groups seen in FIG. 4 is for (very) schematic illustrative purposes only, and that the delays applied need not necessarily progress in length with each delay module, nor will the user's perception of the crowd voices form a neat rectangle in an imagined space. It will also be appreciated that a reasonably uniform distribution of delays, such as a random distribution, within bounds consistent with acoustic paths lengths reasonable for a stadium, can combine to populate the virtual acoustic environment to a similar degree to that illustrated by FIG. 4.

It will also be appreciated that the attenuation value DIFF does not need to correlate inversely with the delay time, although this does result in a preferable sense of distance in the resulting output. It will also be appreciated that large values of DIFF (even values resulting in amplification not attenuation) may give rise to increased noise and are preferably avoided. Likewise, it will be appreciated that the delays applied do not need to be in a specific sequence, although it will be understood that having the longest delay first and the shortest delay last enables the compound attenuation of the associated DIFF factors to most closely resemble attenuation with acoustic path length.

Similarly, it will also be apparent that other than four delay modules may be used, and that delays and DIFF levels may be varied between or during user inputs and between audio channels.

Figure 5:
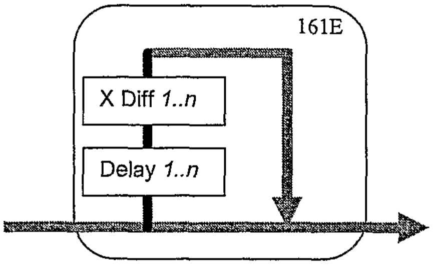
FIG. 5 is a block diagram of a recursive delay means in accordance with an embodiment of the present invention.

Finally, it will be apparent that whilst the delay modules are described herein as discrete entities, in an embodiment of the present invention the delay means is a single delay module that runs a series of two or more delay operations acting on (and generating) respective versions of the input data stream (i.e. the input to the delay module, in other words the output of the pitch shifter 150). Referring to FIG. 5, such a delay module 161E will typically be a software module in which a common delay function is recursively applied to n different data streams representing the cumulatively modified signal after each additional operation of the delay module, with variables such as the delay and DIFF value being dependent upon which data stream is being modified. Clearly, such a module could also be coupled with additional discrete delay modules in any suitable sequence.

The crowd reverberation unit 160 typically operates on both channels of a stereo signal, and thus optionally the apparent direction of a crowd with respect to the user may be controlled by the relative left and right amplitudes, for example to create a 'Mexican wave' or drive-past effect. Similarly, if channels for a 5.1 surround-sound output are being processed, then optionally each channel can be manipulated in terms of volume and overall delay to localise the apparent main source of the crowd noise relative to the user.

The output of the crowd reverberation unit 160 is passed to a distortion filter 170 that removes any vocoder artefacts, such as a metallic ringing sound. Alternatively or in addition, the distortion filter 170 can optionally simulate the microphone saturation that would occur if the crowd noise were extremely loud.

The output of the distortion filter is then passed to the mixer 180.

In an embodiment of the present invention, in parallel with the above processing by the channel vocoder 140, pitch shifter 150, crowd reverberation unit 160, and distortion filter 170, a generic background crowd noise is supplied for addition at the mixer 180 by crowd noise generator 130. This has the effect of filling out the frequency spectrum of the resulting audio, and can help to mask any apparent cross-correlation in the chanting by adding other vocalisations.

The generic background crowd noise is switched on or off by a microphone input detector 120, for example a voice activity detector as known in the art. Preferably, such a detector will include on/off hysteresis so that the background crowd noise will span any momentary silences between words in the user's chant.

The generic background crowd noise itself may be a recording, typically played from a random start point with each use, or alternatively may be generated by synthesis, overlayed crowd samples, or a mixture of the two.

The generated crowd chant signal, based upon the final output of the crowd reverberation unit together with any distortion filtration, is then mixed by the mixer 180 with the background crowd noise signal, and output as one or more audio channels as appropriate.

It will be clear to a person skilled in the art that embodiments of the present invention may not require the provision of a pitch-shifter 150, distortion filter 170, or crowd noise generator 130 (and consequently mixer 180). Similarly, it will be apparent that in embodiments of the present invention, the crowd noise generator 130 could operate serially with other elements, for example adding crowd noise to the signal before or after the distortion filter 170.

It will similarly be clear that the microphone-input detector 120 could control both the crowd noise generator 130 and the channel vocoder 140. Likewise, alternatively or in addition these processes could be controlled by a user selection via an user interface, or by an in-game event.

It will be further clear that if the input is pre-recorded, for example when developing a game, then a microphone 110 may not be necessary if it is not desired that the user can add their own chants during play.

Whilst the above description has referred to stadia, it will also be appreciated that other crowds may be simulated, such as at a golf course or on a road side, or for performing at a virtual concert where the user sings into the microphone and a crowd of fans sings back. For such applications, the second diffusion delay unit may not be necessary as there is no opposite half of a stadium to simulate. The simulation characteristics, i.e. the delays and coefficients DIFF in the above embodiments, may be stored as metadata associated with (for example) a game, to allow different types of crowd noise to be generated in dependence on the current virtual location of game action (i.e. in the game's virtual world).

Similarly, whilst the above description refers to crowd chants, it will be clear that this is dependent upon a chant being input to the apparatus. Thus more generally, an input sound will result in a corresponding crowd-like sound.

In a further embodiment of the present invention, alternatively or in addition to the user being able to generate their own crowd chants to enhance the atmosphere of their own gaming experience, for multiplayer games where two or more games machines are networked together, the player can send a chant to the games machine of one or more other players to support or taunt them during play.

Preferably, to reduce network bandwidth use, efficiently transmissible data is sent to the games machines of the one or more other players, namely the vocoder spectral parameters. The remainder of the audio process is then applied by each receiving machine. Alternatively, users may pre-record their chants, for instance in a configuration phase of a game, and these may be distributed to the other networked machines playing the game so that they can use the chant from a cache without further transmissions.

Figure 6:
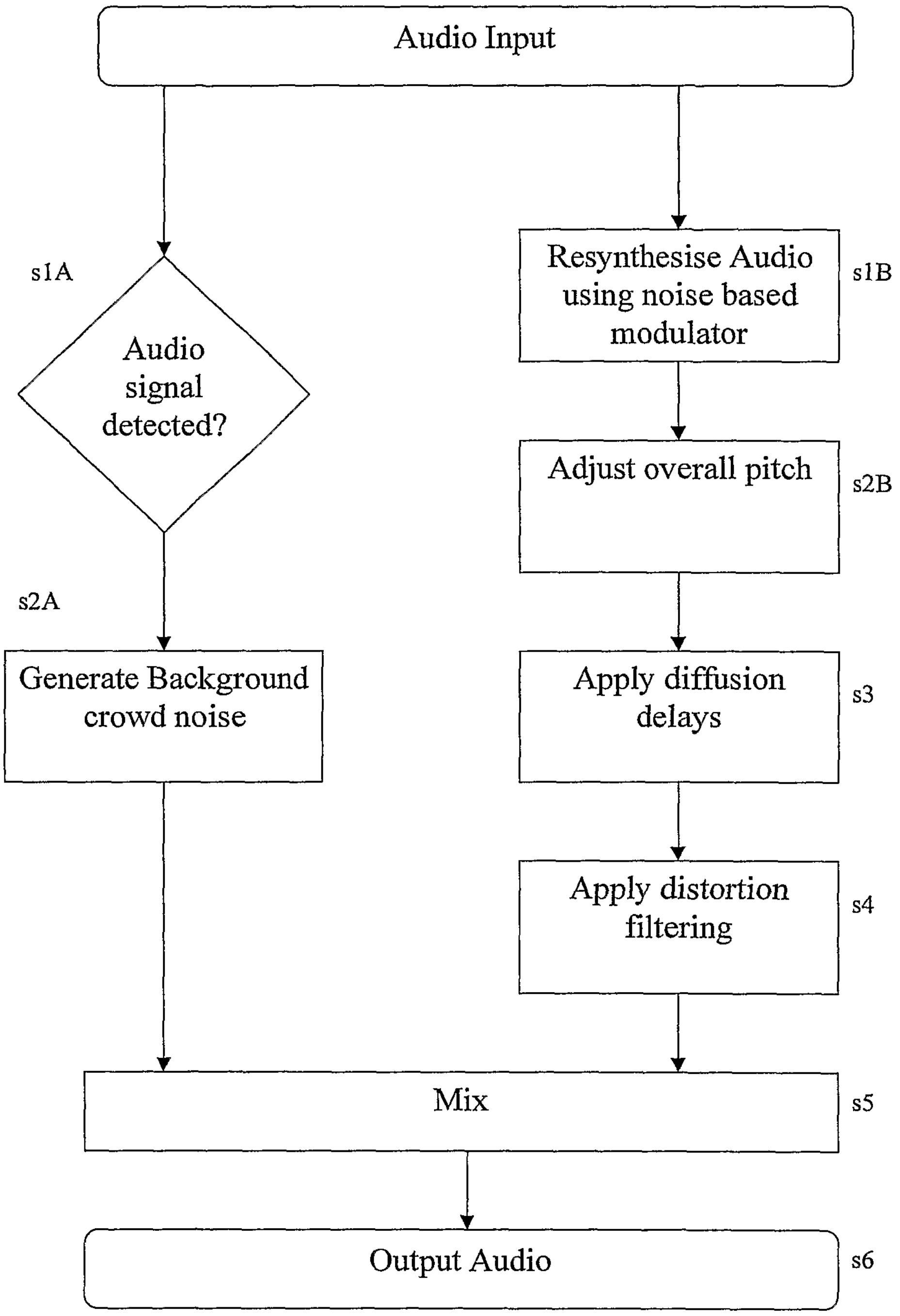
FIG. 6 is a flow diagram of an audio process for generating crowd chants in accordance with an embodiment of the present invention.

Referring to FIG. 6, an audio process conducted in operation by a crowd chant apparatus 100 comprises the following steps, given an audio input:

s1A. Detect any audio signal on the input;

s2A. Upon detection, generate background crowd noise;

s1B. Resynthesise the audio signal using a noise-based modulator;

s2B. Adjust the overall pitch;

s3. Apply diffusion delay;

s4. Apply distortion filtering;

s5. Mix the output of s4 with the background crowd noise of s2A;

s6. Output as audio.

It will be appreciated that variations of this process corresponding to those variations of apparatus and apparatus operation disclosed previously are envisaged within the scope of the invention.

A consequent product of the above audio process will be a generated audio stream or file based upon an audio input (typically the voice of a games player or developer) that resembles a crowd chant in a stadium or other gathering space.

It will be appreciated that in embodiments of the present invention, steps of the audio process and the corresponding elements of the crowd chant apparatus 100 may be located in one or more games machines in any suitable manner, so that a first games machine generates a partially-processed signal, with one or more other games machines being arranged to complete the processing described above. For example, a first games machine may generate the vocoder sub-bands, and then transmit them to a second games machine where the remainder of the process is then carried out. It is expected that a suitable games machine will be the Sony® PlayStation 3® machine.

Consequently the present invention may be implemented in any suitable manner to provide suitable apparatus or operation between a plurality of games machines. In particular, it may consist of a single discrete entity in the form of a games machine, or it may be coupled with one or more additional entities added to a conventional games machine, or may be formed by adapting existing parts of a games machine, such as by software reconfiguration.

Thus adapting existing parts of a conventional games machine may comprise for example reprogramming of one or more processors therein. As such the required adaptation may be implemented in the form of a computer program product comprising processor-implementable instructions stored on a data carrier such as a floppy disk, optical disk, hard disk, PROM, RAM, flash memory or any combination of these or other storage media, or transmitted via data signals on a network such as an Ethernet, a wireless network, the internet, or any combination of these or other networks.

Similarly, the product of the audio process may be incorporated within a game, or transmitted during a game, and thus may take the form of a computer program product comprising processor-readable data stored on a data carrier such as a floppy disk, optical disk, hard disk, PROM, RAM, flash memory or any combination of these or other storage media, or may be transmitted via data signals on a network such as an Ethernet, a wireless network, the internet, or any combination of these or other networks.

Finally, it will be clear to a person skilled in the art that embodiments of the present invention may variously provide some or all of the following advantages:

i. A cost-effective method and means for a games developer to obtain specific crowd chants;

ii. A method and means by which a game player can customise or add crowd chants in a game, and;

iii. A method and means by which, over a network, a game player can support or taunt another player, and which is in keeping with the atmosphere of the game.

The invention claimed is:

1. An audio apparatus for generating crowd sounds from an audio signal, the apparatus comprising:

a modulator operable to modulate a noise signal in response to the audio signal to generate a modulated noise signal; and a diffusion delay arrangement; in which:

the diffusion delay arrangement is operable to apply a series of two or more delay operations, an input signal to a first such delay operation in the series of two or more delay operations being the modulated noise signal, an input to each subsequent delay operation in the series of two or more delay operations being an output signal generated by a preceding delay operation;

each delay operation comprising modifying that operation's input signal by the addition of one delayed version of that operation's input signal and outputting a result, the result comprising that operation's input signal overlaid with the one delayed version of that operation's input signal.

2. An audio apparatus according to claim 1 in which the diffusion delay arrangement comprises a single recursive delay arrangement operable to apply a series of two or more delay operations.

3. An audio apparatus according to claim 1 in which the diffusion delay arrangement comprises a sequence of two or more delay arrangements each operable to apply a delay operation.

4. An audio apparatus according to claim 1, in which a delay operation attenuates the one delayed version of that operation's input signal.

5. An audio apparatus according to claim 1, comprising:

a crowd noise generator operable to generate background crowd noise, and a mixer operable to mix the background crowd noise with a signal representing the crowd sounds.

6. An audio apparatus according to claim 1 in which two or more diffusion delay arrangements and a diffusion delay mixer are provided such that in operation the output of a first diffusion delay arrangement is passed as input to a second diffusion delay arrangement and also to the diffusion delay mixer, and the output of the second diffusion delay arrangement is also passed to the diffusion delay mixer and mixed with the output of the first diffusion delay arrangement.

7. An audio apparatus according to claim 1, comprising a distortion filter operable to remove at least some unwanted audio artifacts introduced by the operation of the modulator.

8. An audio apparatus according to claim 1 further comprising a pitch shifter operable to adjust the mean pitch of the modulated signal.

9. An audio apparatus according to claim 1 operable to be activated by any or all of:

i. detection of audio by an audio input detector;

ii. activation selection via a user interface, and;

iii. an in-game event.

10. A games machine comprising an audio apparatus according to claim 1.

11. A games machine according to claim 10, further operable to transmit a signal partially processed by the audio apparatus to another games machine.

12. A games machine according to claim 10, in which the signal comprises frequency characteristics of the audio signal.

13. A games machine comprising an audio apparatus according to claim 10, the audio apparatus being further operable to complete the processing of a partially processed signal received from another games machine.

14. A non-transitory computer readable data carrier comprising computer readable instructions that, when loaded into a computer, cause the computer to operate as a games machine according to claim 10.

15. A non-transitory computer readable data carrier comprising computer readable instructions that, when loaded into a computer, cause the computer to operate as an audio apparatus according to claim 1.

16. The audio apparatus of claim 1, wherein the modulator is configured to modulate the noise signal by:

splitting the audio signal into a plurality of frequency bands; and using an amplitude of each of the plurality of frequency bands to shape the noise signal to give the noise signal frequency characteristics of the audio signal such that the noise signal is spectrally modulated by formants of any speech within the audio signal.

17. A method of audio processing for generating crowd sounds from an audio signal, the method comprising the steps of:

modulating a noise signal in response to an audio signal to generate a modulated noise signal, and;

applying a series of two or more delay operations, an input signal to a first such delay operation in the series of two or more delay operations being the modulated noise signal, an input to each subsequent delay operation in the series of two or more delay operations being an output signal generated by a preceding delay operation, and in which:

each delay operation comprises modifying that operation's input signal by the addition of one delayed version of that operation's input signal and outputting a result, the result comprising that operation's input signal overlaid with the one delayed version of that operation's input signal.

18. A method according to claim 17, comprising the step of mixing a background crowd noise with a signal based upon the output of the final delay operation in the series.

19. A method according to claim 17, comprising the step of filtering to remove at least some modulation artifacts introduced by modulating the noise signal.

20. A method according to claim 17, comprising the step of adjusting the mean pitch of the modulated noise signal.

21. A method according to claim 17 in which the method is instigated by any or all of:

i. detection of audio by an audio input detector;

ii. activation selection via a user interface;

iii. an in-game event.

22. A non-transitory computer readable data carrier comprising computer readable instructions that, when loaded into a computer, cause the computer to carry out the method of claim 17.

23. A non-transitory computer readable data carrier comprising computer readable data embodying a crowd chant audio signal generated according by the method of claim 17.

24. The method of claim 17, wherein modulating the noise signal comprises:

splitting the audio signal into a plurality of frequency bands; and shaping the noise signal, using an amplitude of each of the plurality of frequency bands, to give the noise signal frequency characteristics of the audio signal such that the noise signal is spectrally modulated by formants of any speech within the audio signal.

* * * * *